(12) United States Patent
Wu et al.

(10) Patent No.: US 10,719,687 B2
(45) Date of Patent: Jul. 21, 2020

(54) DISPLAY PANEL CAPABLE OF FINGERPRINT IDENTIFICATION

(71) Applicant: WUHAN CHINA STAR OPTOELECTRONICS SEMICONDUCTOR DISPLAY TECHNOLOGY CO., LTD., Wuhan, Hubei (CN)

(72) Inventors: Shaojing Wu, Hubei (CN); Shuang Li, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 51 days.

(21) Appl. No.: 16/303,187

(22) PCT Filed: Sep. 5, 2018

(86) PCT No.: PCT/CN2018/104053
§ 371 (c)(1),
(2) Date: Nov. 20, 2018

(87) PCT Pub. No.: WO2020/019411
PCT Pub. Date: Jan. 30, 2020

(65) Prior Publication Data
US 2020/0034598 A1    Jan. 30, 2020

(51) Int. Cl.
*G06K 9/00* (2006.01)
*H01L 27/32* (2006.01)

(52) U.S. Cl.
CPC ........ *G06K 9/0004* (2013.01); *H01L 27/3223* (2013.01)

(58) Field of Classification Search
CPC ............ G06K 9/0004; G06K 9/00053; G06K 9/0002; G06K 9/741; H05K 1/028; H05K 1/118; G06F 3/0412; H01L 27/3223
See application file for complete search history.

(56) References Cited

U.S. PATENT DOCUMENTS

| 2016/0086977 | A1* | 3/2016 | Go | H01L 27/124 257/773 |
| 2017/0125501 | A1* | 5/2017 | Lim | H01L 27/3244 |

(Continued)

FOREIGN PATENT DOCUMENTS

| CN | 106295611 A | 1/2017 |
| CN | 107194321 A | 9/2017 |
| CN | 108269503 A | 7/2018 |

*Primary Examiner* — Premal R Patel
(74) *Attorney, Agent, or Firm* — Mark M. Friedman

(57) ABSTRACT

A display panel capable of fingerprint identification includes a base substrate, a TFT layer, a pixel unit, and a dummy pixel. The base substrate includes a display area and a non-display area. The dummy pixel is formed on the TFT layer where the pixel unit is arranged as well, and distributed in the non-display area. The non-display area comprises a fingerprint identification cue area configured to transmit fingerprint information to a fingerprint identification module. The fingerprint identification module is arranged on one side of the TFT layer facing away from the dummy pixel. When a finger touches the fingerprint identification cue area, a light is emitted from the fingerprint identification cue area to the finger. The fingerprint identification module is configured to implement fingerprint identification based on the light that is reflected from a surface of the finger and passes through a gap between the dummy pixels.

10 Claims, 4 Drawing Sheets

(56) References Cited

U.S. PATENT DOCUMENTS

| | | | |
|---|---|---|---|
| 2017/0169791 A1* | 6/2017 | Xin | G02F 1/136213 |
| 2017/0194380 A1* | 7/2017 | Fujino | H01L 27/322 |
| 2017/0270342 A1* | 9/2017 | He | G06F 3/042 |
| 2018/0082630 A1* | 3/2018 | Kim | G09G 3/3233 |
| 2018/0107241 A1* | 4/2018 | Evans, V | G06F 3/041 |
| 2018/0204492 A1* | 7/2018 | Kuo | G09G 3/006 |
| 2019/0034020 A1* | 1/2019 | He | G06K 9/00033 |
| 2019/0213374 A1* | 7/2019 | Kwon | G06F 3/0412 |
| 2019/0286870 A1 | 9/2019 | Ling et al. | |
| 2019/0294848 A1 | 9/2019 | Zeng et al. | |
| 2020/0013834 A1* | 1/2020 | Park | H01L 27/3246 |

* cited by examiner

DISPLAY PANEL CAPABLE OF FINGERPRINT IDENTIFICATION

BACKGROUND

1. Field of the Disclosure

The present disclosure relates to the technical field of a display screen, and more particularly, to a display screen capable of fingerprint identification.

2. Description of the Related Art

An active-matrix organic light-emitting diode (AMOLED) display panel has gradually become the mainstream product in the next-generation display technology owing to their high contrast, wide color gamut, low power consumption, and foldability. In the field of cellphone display, to increase the screen-to-body ratio and to enlarge the display area, a cutting method called U-Cut for an irregular area is adopted in the panel technology of the related art. As illustrated in FIG. 1, the display panel includes a display area 03 and a non-display area. A U-shaped area 01 is cut from the non-display area on the upper portion of the display panel for placing an earpiece, a front camera, etc. However, such a design causes unbalanced illumination due to the resistor-capacitor (RC) loading around the U-shaped area 01, and the irregular cutting itself is liable to produce undesirable results. In addition, a fingerprint identification module in a cellphone of the related art is designed under the display panel (such as the fingerprint identification area 02 in FIG. 1) or the back of the cellphone, which may cause a problem like relatively low screen-to-body ratio or very complicated design.

Therefore, it is necessary to propose a display panel to solve the problems of the related art.

SUMMARY

The disclosure proposes a display panel having fingerprint identification. Fingerprint identification technology can be integrated into an irregular area of the display panel without irregular cutting. Not only the yield rate is ensured but also the screen-to-body ratio is enhanced.

According to one aspect of the present disclosure, a display panel capable of fingerprint identification comprises a base substrate, a thin-film transistor (TFT) layer, a pixel unit, and a dummy pixel. The base substrate includes a display area and a non-display area. The thin-film transistor (TFT) layer formed on the base substrate comprises a plurality of data lines and a plurality of gate lines. The pixel unit is formed on the TFT layer and is distributed in the display area in an array. The dummy pixel is formed on the TFT layer where the pixel unit is arranged as well, and distributed in the non-display area. The non-display area comprises a fingerprint identification cue area configured to transmit fingerprint information to a fingerprint identification module. The fingerprint identification module is arranged on one side of the TFT layer facing away from the dummy pixel. When a finger touches the fingerprint identification cue area, a light is emitted from the fingerprint identification cue area to the finger. The fingerprint identification module is configured to implement fingerprint identification based on the light that is reflected from a surface of the finger and passes through a gap between the dummy pixels.

According to one embodiment of the present disclosure, a distributive density of the dummy pixel in the non-display area is lower or far lower than a distributive density of the pixel unit in the display area.

According to one embodiment of the present disclosure, the non-display area comprises a camera area. The camera area is configured to set a front camera; the distributive density of the dummy pixel in the camera area is lower than or equal to the distributive density of the dummy pixel in the fingerprint identification cue area. The front camera is correspondingly arranged between two of the adjacent dummy pixel.

According to one embodiment of the present disclosure, the camera area and the fingerprint identification cue area are arranged at the same side of the display area. The camera area and the fingerprint identification cue area are adjacent.

According to one embodiment of the present disclosure, the camera area and the fingerprint identification cue area are arranged on the both sides of the display area.

According to one embodiment of the present disclosure, the plurality of data lines and the plurality of gate lines are distributed in the non-display area. The plurality of data lines and the plurality of gate lines are arranged at least every two rows/columns of the dummy pixels.

According to one embodiment of the present disclosure, some of the dummy pixels in the fingerprint identification cue area is configured to illuminate to strengthen a reflected light signal received by the fingerprint identification module.

According to one embodiment of the present disclosure, one or more of the dummy pixels are adjacent to the plurality of data lines are connected to the plurality of data lines. One or more of the dummy pixels are adjacent to the plurality of gate lines are connected to the plurality of gate lines. One or more of the dummy pixels connected to the plurality of data lines and the plurality of gate lines are configured to illuminate.

According to one embodiment of the present disclosure, edges of both sides of the display area of the display panel are partially bent to form two sides. The fingerprint identification cue area is arranged on one of the sides of the display panel.

According to one embodiment of the present disclosure, some of the dummy pixels in the fingerprint identification cue area are configured to illuminate. The fingerprint identification module is arranged on a back of the display panel.

The present disclosure which proposes the display panel having fingerprint identification brings benefits that the screen-to-body ratio is enhanced by integrating the fingerprint identification technology into the non-display area (irregular area), that the unbalanced illumination of the display panel is improved by remaining the non-display area uncut and arranging low-density dummy pixels, the data lines, and the gate lines in the non-display area. In addition, some of the dummy pixels in the fingerprint identification cue area can be configured to illuminate, which helps to enhance reflected light signals received by the fingerprint identification module and to improve the fingerprint identification capability.

BRIEF DESCRIPTION OF THE DRAWINGS

In order to more clearly illustrate the embodiments of the present disclosure or related art, the following figures will be described in the embodiments are briefly introduced. It is obvious that the drawings are merely some embodiments of the present disclosure, those of ordinary skill in this field can obtain other figures according to these figures without paying the premise.

DETAILED DESCRIPTION OF THE EMBODIMENTS

In the disclosure, it is should be understood that spatially relative terms, such as "center", "longitudinal", "lateral", "length", "width", "above", "below", "front", "back", "left", "right", "horizontal", "vertical", "top", "bottom", "inner", "outer", "clockwise", "counterclockwise", "axial", "radial", "circumferential", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The spatially relative terms are not limited to specific orientations depicted in the figures. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

The present disclosure is directed to a fingerprint identification display panel of the related art. Due to the cutting method of irregular area, the display area around the irregular area is unevenly illuminated. Besides, the design of a fingerprint identification module may cause reduction in the screen-to-body ratio. The present embodiment can solve the above-mentioned drawbacks.

Figure 1:
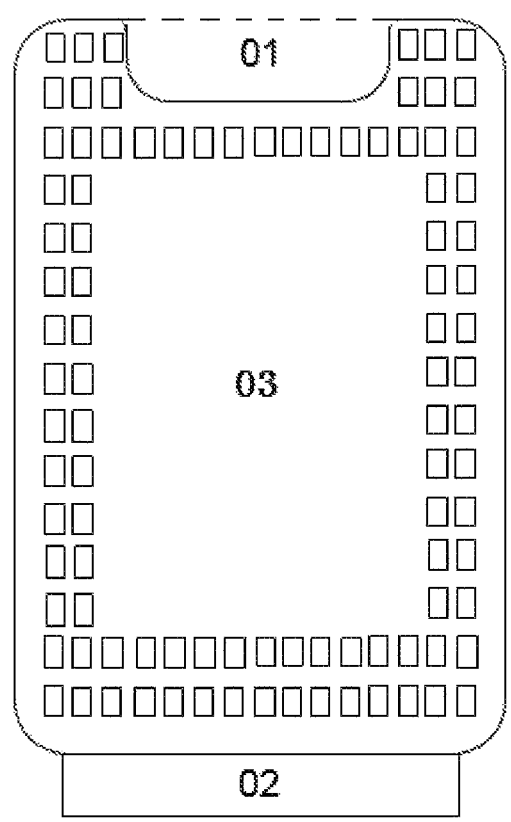
FIG. 1 illustrates a structure of a display panel using U-Cut technology of the related art.
Figure 2:
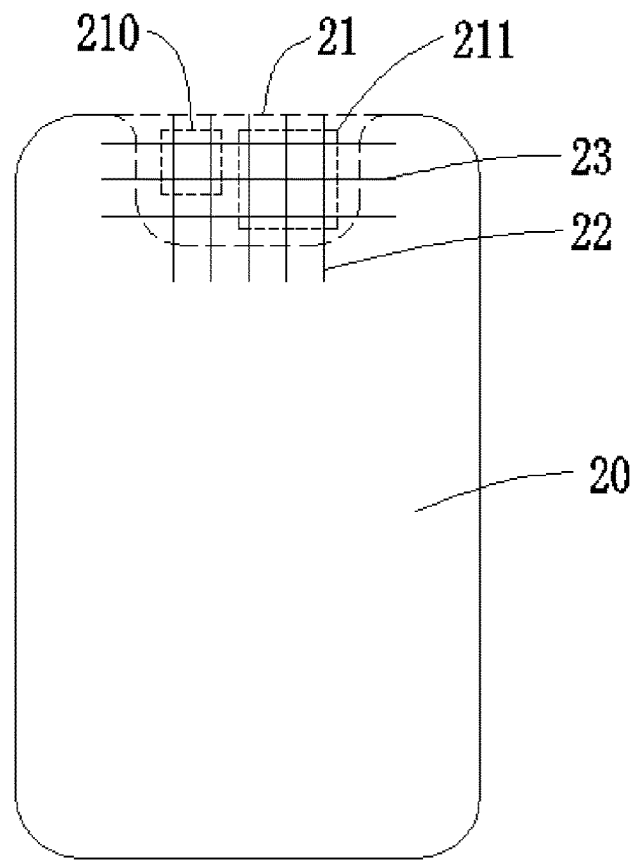
FIG. 2 is a schematic diagram of the structure of a display panel capable of fingerprint identification according to a first embodiment of the present disclosure.

FIG. 2 is a schematic diagram of the structure of a display panel capable of fingerprint identification according to a first embodiment of the present disclosure. The display panel includes a base substrate. The base substrate includes a display area 20 and a non-display area 21. The non-display area 21 is irregular. The non-display area 21 is cut off so that an earpiece, a front camera, etc., can be arranged on the cut-off area. A thin-film transistor (TFT) layer is formed on the base substrate. The TFT layer includes a plurality of data lines 22 and a plurality of gate lines 23. A pixel unit is formed on the TFT layer and distributed in the display area 20 in an array. The pixel unit is configured to display images. A dummy pixel is formed on the TFT layer where the pixel unit is arranged as well. Besides, the dummy pixel is distributed in the non-display area 21 in an array. The non-display area 21 includes a camera area 210 and a fingerprint identification cue area 211. The camera area 210 is configured to set a front camera. The fingerprint identification cue area 211 is configured to transmit fingerprint information to the fingerprint identification module. The fingerprint identification module is arranged on one side of the TFT layer facing away from the dummy pixel. It is notified that the location of the fingerprint identification module is not specifically limited; in other words, the fingerprint identification module may be arranged on another film layer facing away from the TFT layer. The camera area 210 may be arranged on the non-display area 21 everywhere as long as outside the fingerprint identification cue area 211. The data line 22 and the gate line 23 are distributed in the non-display area 21. The data line 22 and the gate line 23 in the non-display area 21 are arranged at least every two rows/columns of the dummy pixels. The distributive density of the dummy pixels in the non-display area 21 is lower or far lower than the distributive density of the pixel unit in the display area 20.

The non-display area 21 is not cut. The data line 22 and the gate line 23 arranged in the non-display area 21 and the dummy pixel can reduce the RC loading around the non-display area 21, thereby improving the imbalance of light emission of the display panel.

Figure 3A:
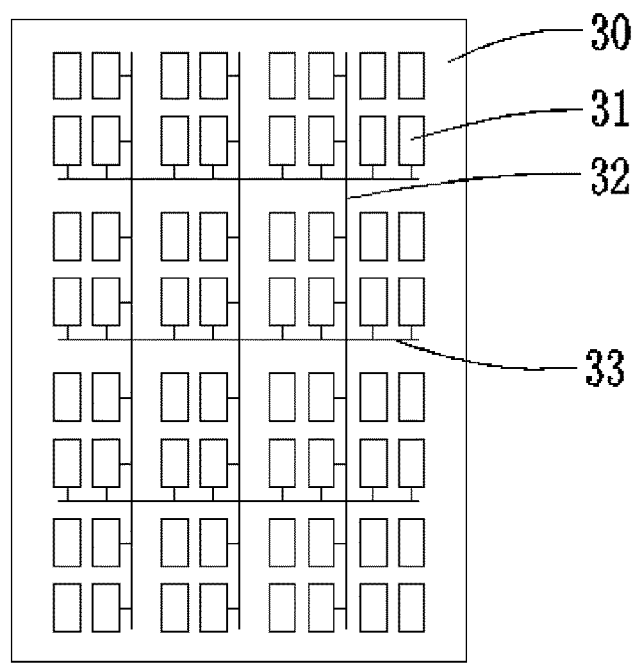
FIG. 3A is a schematic diagram of the structure of a fingerprint identification cue area according to the present embodiment of the present disclosure.

FIG. 3A is a schematic diagram of the structure of a fingerprint identification cue area 30 according to the present embodiment of the present disclosure. The fingerprint identification cue area 30 includes a dummy pixel 31, a plurality of data lines 32, and a plurality of gate lines 33. The data lines 32 are arranged every two columns of dummy pixels 31. The gate lines 33 are arranged every two rows of dummy pixels 31. Without limitation herein, the data lines 32 and the gate lines 33 may be distributed in a plurality of columns/rows. One or more of the dummy pixels 31 adjacent to the data line 32 are connected to the data line 3. One or more of the dummy pixels 31 adjacent to the gate line 33 are connected to the gate line 33. The dummy pixels 31 in the fingerprint identification cue area 30 may not emit light or may emit light partially. In another embodiment, one or more dummy pixels 31 connected to a data line 32 and a gate line 33 are available for illumination.

Figure 3B:
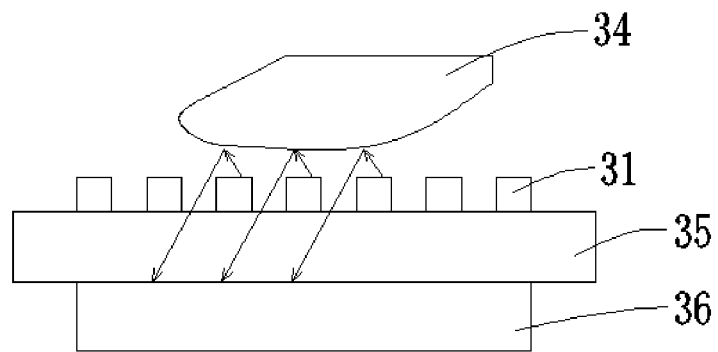
FIG. 3B illustrates a fingerprint identification principle according to the embodiment of the present disclosure.

FIG. 3B illustrates a fingerprint identification principle according to the embodiment of the present disclosure. When a finger 34 touches the fingerprint identification cue area 30, the light emitted from the fingerprint identification cue area 30 to the fingerprint is totally or diffusely reflected. The reflected light passes through the gap between the dummy pixels 31 through the fingerprint identification cue area 30 into the fingerprint identification module 36. The fingerprint identification module 36 implements fingerprint identification based on the information of the light reflected by the fingerprint. Because some of the dummy pixels 31 are configured to send out light, the fingerprint identification module 36 can receive a stronger reflected light signal, and the fingerprint identification capability can become powerful as well. Furthermore, to enhance the intensity of the reflected light signal, the density of the dummy pixels 31, the data lines 32, and the gate lines 33 arranged in the fingerprint identification cue area 30 is very low. A film layer between the dummy pixel 31 and the fingerprint identification module 36 is a transmissive film layer or a highly transmissive film layer.

The camera area is similar to the setting of the fingerprint identification cue area. The distributive density of the dummy pixels in the camera area is lower than or equal to the distributive density of the dummy pixels in the fingerprint identification cue area. The front camera is correspondingly arranged between two of the adjacent dummy pixels. In another embodiment, a front camera is arranged in a wiring area where no data lines and gate lines are arranged, and the front camera is not blocked by a dummy pixel.

Figure 4:
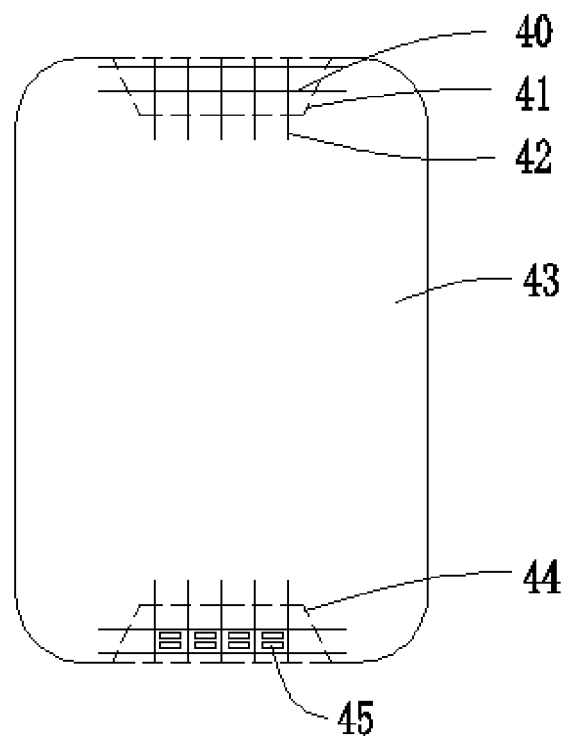
FIG. 4 is a schematic diagram of the structure of a display panel capable of fingerprint identification according to a second embodiment of the present disclosure.

FIG. 4 is a schematic diagram of the structure of a display panel capable of fingerprint identification according to a second embodiment of the present disclosure. Compared with the first embodiment, the second embodiment is a design of double irregularity; that is, a camera area 41 and a fingerprint identification cue area 44 of a non-display area are arranged on both sides of a display area 43, respectively. The camera area 41 and the fingerprint identification cue area 44 are non-display areas, but each of the camera area 41 and the fingerprint identification cue area 44 includes a data line 42 and a gate line 40 therein. Relative to the display area 43, the distributive density of the data line 42 and the distributive density of the gate line 40 in the camera area 41 and the fingerprint identification cue area 44 are lower or substantially lower than the wiring density in the display area 43. Dummy pixels 45 are arranged in an array in the fingerprint identification cue area 44. The dummy pixels 45 are not configured to display images. The distributive density of the dummy pixels 45 in the non-display area is lower or far lower than a distributive density of the pixel unit in the display area. In another embodiment, a data line 42 and a gate line 40 are arranged at intervals of every several columns/rows of dummy pixels 45. A fingerprint identification module for fingerprint identification is correspondingly arranged on a film layer below a fingerprint identification cue area 44 or the back of a display panel. Some of the dummy pixel 45 can be configured to illuminate. When a finger touches the fingerprint identification cue area 44, the light emitted by the fingerprint identification cue area 44 is reflected by the finger, passes through the gap between the two adjacent dummy pixels 45, and then enters the fingerprint identification module. The identification module is an optical fingerprint identification module which performs fingerprint identification according to the light signal reflected by the finger.

In another embodiment, a front camera is arranged in a wiringless area in a camera area 41. In addition, the camera area 41 may also include a dummy pixel 45 which is similar to that arranged in the fingerprint identification cue area 44. The dummy pixel 45 in the camera area 41 is not configured to display nor illuminate. In the embodiment, all of the non-display areas are not cut.

Figure 5:
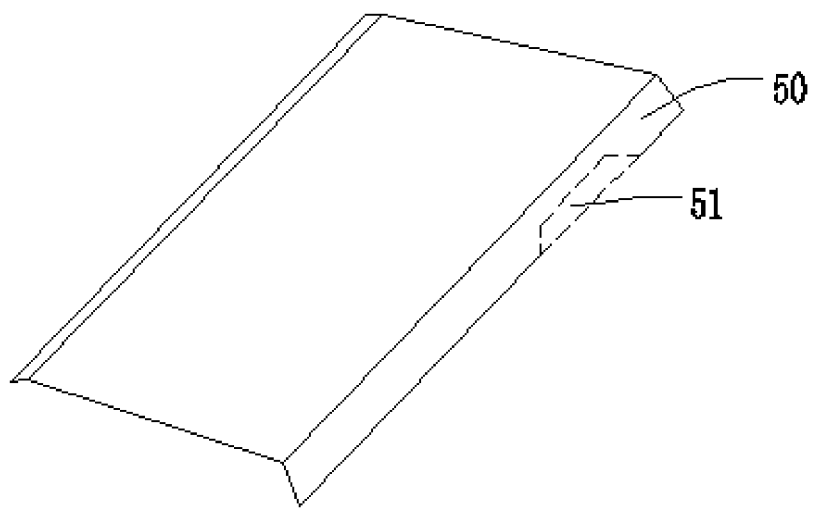
FIG. 5 is a schematic diagram of the structure of a display panel capable of fingerprint identification according to a third embodiment of the present disclosure.

FIG. 5 is a schematic diagram of the structure of a display panel capable of fingerprint identification according to a third embodiment of the present disclosure. The edges of both sides of a display area 50 of the display panel are partially bent to the sides of a smartphone to form two sides of the smartphone by using a so-called edge curve technology of the related art. Next, a non-display area 51 (irregular area) is designed and arranged at the both sides (or one side) of the display panel. As described above, the non-display area 51 may not be cut. Next, low-density dummy pixels are arranged in the non-display area 51 only. Some of the dummy pixels are available for illumination. Finally, an optical fingerprint identification module is designed on the back of the display panel. As for the specific fingerprint identification principle, please refer to the first embodiment, and details are not described herein again. The non-display area 51 can also be cut. In addition to a fingerprint identification module, a volume key/lock screen key of the smartphone can be designed in the cut-off non-display area 51.

The shape and size of the dummy pixel is not limited in the present disclosure; in other words, the dummy pixel may be shaped as a rectangular, diamond, or a strip.

The present disclosure which proposes the display panel having fingerprint identification brings benefits that the screen-to-body ratio is enhanced by integrating the fingerprint identification technology into the non-display area (irregular area), that the unbalanced illumination of the display panel is improved by remaining the non-display area uncut and arranging low-density dummy pixels, the data lines, and the gate lines in the non-display area. In addition, some of the dummy pixels in the fingerprint identification cue area can be configured to illuminate, which helps to enhance reflected light signals received by the fingerprint identification module and to improve the fingerprint identification capability.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A display panel capable of fingerprint identification, comprising:
a base substrate, comprising a display area and a non-display area;
a thin-film transistor (TFT) layer, formed on the base substrate, and comprising a plurality of data lines and a plurality of gate lines;
a pixel unit, formed on the TFT layer, and distributed in the display area in an array;
a dummy pixel, formed on the TFT layer where the pixel unit is arranged as well, and distributed in the non-display area;
the non-display area, comprising a fingerprint identification cue area configured to transmit fingerprint information to a fingerprint identification module;
the fingerprint identification module, arranged on one side of the TFT layer facing away from the dummy pixel;
wherein when a finger touches the fingerprint identification cue area, a light is emitted from the fingerprint identification cue area to the finger;
the fingerprint identification module is configured to implement fingerprint identification based on the light that is reflected from a surface of the finger and passes through a gap between the dummy pixels.

2. The display panel of claim 1, wherein a distributive density of the dummy pixel in the non-display area is lower or far lower than a distributive density of the pixel unit in the display area.

3. The display panel of claim 2, wherein the non-display area comprises a camera area; the camera area is configured to set a front camera; the distributive density of the dummy pixel in the camera area is lower than or equal to the distributive density of the dummy pixel in the fingerprint identification cue area; the front camera is correspondingly arranged between two of the adjacent dummy pixel.

4. The display panel of claim 3, wherein the camera area and the fingerprint identification cue area are arranged at the same side of the display area; the camera area and the fingerprint identification cue area are adjacent.

5. The display panel of claim 3, wherein the camera area and the fingerprint identification cue area are arranged on the both sides of the display area.

6. The display panel of claim 1, wherein the plurality of data lines and the plurality of gate lines are distributed in the non-display area; the plurality of data lines and the plurality of gate lines are arranged at least every two rows/columns of the dummy pixels.

7. The display panel of claim 6, wherein some of the dummy pixels in the fingerprint identification cue area is configured to illuminate to strengthen a reflected light signal received by the fingerprint identification module.

8. The display panel of claim 7, wherein one or more of the dummy pixels adjacent to the plurality of data lines are connected to the plurality of data lines;
    one or more of the dummy pixels adjacent to the plurality of gate lines are connected to the plurality of gate lines;
    one or more of the dummy pixels connected to the plurality of data lines and the plurality of gate lines are configured to illuminate.

9. The display panel of claim 1, wherein edges of both sides of the display area of the display panel are partially bent to form two sides; the fingerprint identification cue area is arranged on one of the sides of the display panel.

10. The display panel of claim 9, wherein some of the dummy pixels in the fingerprint identification cue area are configured to illuminate; the fingerprint identification module is arranged on a back of the display panel.

* * * * *

UNITED STATES PATENT AND TRADEMARK OFFICE
CERTIFICATE OF CORRECTION

PATENT NO.         : 10,719,687 B2
APPLICATION NO.    : 16/303187
DATED              : July 21, 2020
INVENTOR(S)        : Shaojing Wu and Shuang Li Page 1 of 1

It is certified that error appears in the above-identified patent and that said Letters Patent is hereby corrected as shown below:

On the Title Page

Item (30) Foreign Application Priority Data:
Add:
"July 27, 2018 (CN) 201810846396.X"

Signed and Sealed this
Sixth Day of October, 2020

Andrei Iancu
*Director of the United States Patent and Trademark Office*